THREADING DEVICE WITH MAGAZINE AND METHOD

Filed May 25, 1961 2 Sheets-Sheet 1

INVENTORS.
Cecil A. Lasch Jr.
Archie B. Goff
BY Fehr and Swain
Attorneys

INVENTORS.
Cecil A. Lasch Jr.
Archie B. Goff
BY [signature]
Attorneys

United States Patent Office 3,116,889
Patented Jan. 7, 1964

3,116,889
THREADING DEVICE WITH MAGAZINE AND METHOD

Cecil A. Lasch, Jr., Sunnyvale, and Archie B. Goff, Redwood City, Calif., assignors to Electroglas, Inc., Redwood City, Calif., a corporation of California Filed May 25, 1961, Ser. No. 112,706
8 Claims. (Cl. 242—54)

This invention relates to a threading device with magazine and method, and more particularly to a threading device with magazine and method which is particularly adapted for use in a thermocompression lead bonding machine.

As is well known to those skilled in the art of thermocompression lead bonding machines of the type utilizing the "nail head technique," the threading of the very fine lead wire utilized into the capillary tube which serves as the bonding tool poses a difficult problem. Heretofore, this fine lead wire has been threaded unassisted by hand into the very small openings in the capillaries by the use of finger cots to prevent contamination of the lead wire. This has proved to be very tedious and time consuming for the operators of the thermocompression lead bonding machines. There is, therefore, a need for a new and improved device and method to facilitate the threading of the fine lead wire into the capillaries.

In general, it is an object of the present invention to provide a threading device with magazine and method which overcomes the above named disadvantages.

Another object of the invention is to provide a threading device and method which makes it very easy to thread the fine lead wire into the capillary.

Another object of the invention is to provide a threading device and method of the above character in which the fine lead wire is threaded into the capillary by causing fluid to pass through the capillary and to thereby draw the lead wire into the capillary.

Another object of the invention is to provide a threading device and method of the above character in which the lead wire is threaded through the capillary by application of a vacuum to the capillary.

Another object of the invention is to provide a magazine for the reel on which the wire is wound, for the bonding tool and for the bonding tool holder so that the same can be supplied as a unitary replaceable assembly for the thermocompression lead bonding machine.

Another object of the invention is to provide a magazine of the above character in which the bonding tool is protected by the magazine.

Another object of the invention is to provide a magazine of the above character in which the magazine encloses the reel and the bonding tool so as to prevent contamination of the lead wire by dust and other foreign particles.

Additional objects and features of the invention will appear from the following description in which the preferred embodiment is set forth in detail in conjunction with the accompanying drawings.

Referring to the drawings.

Figures 1, 2:
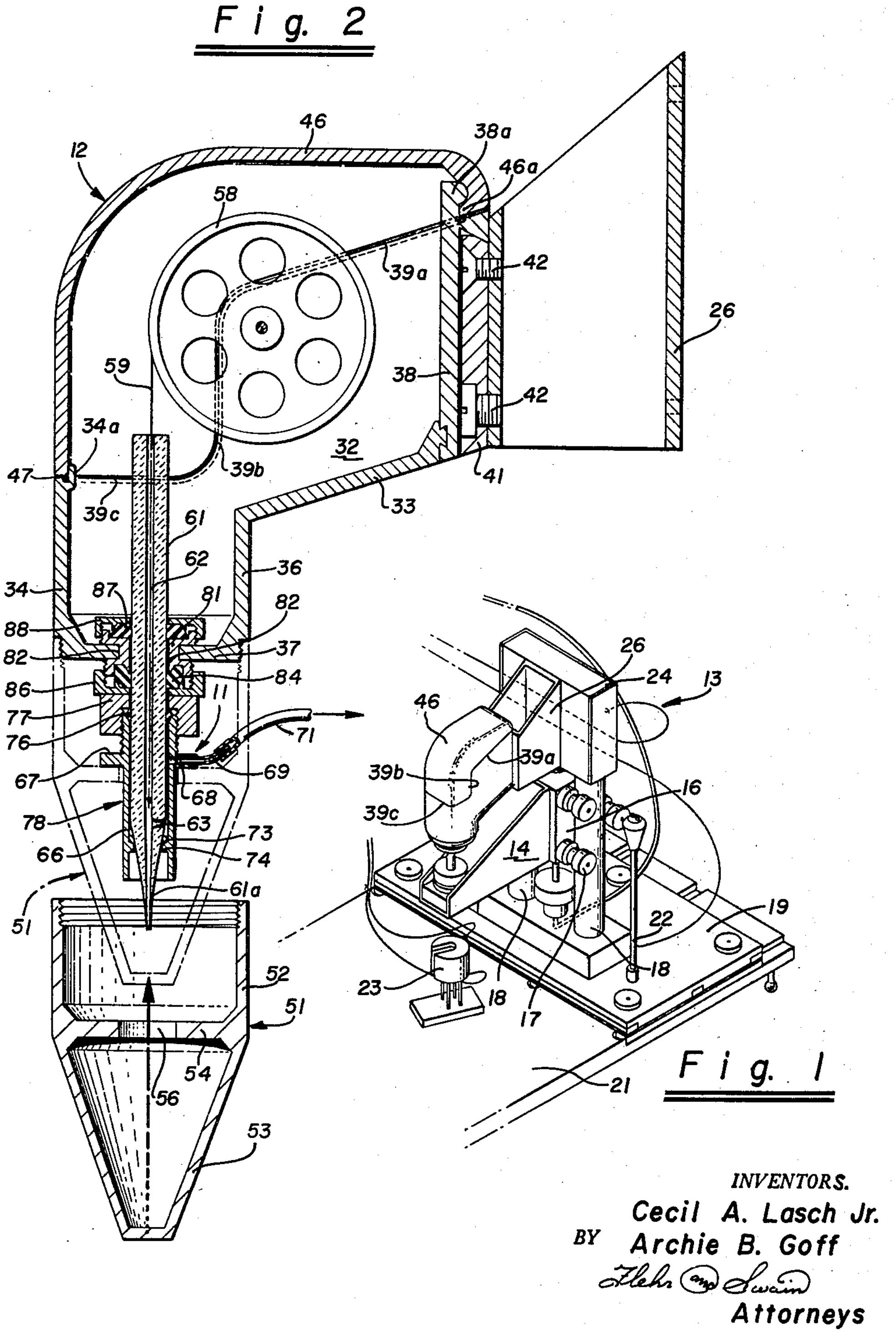
FIGURE 1 is an isometric view of a portion of a thermocompression lead bonding machine incorporating our threading device with magazine.
FIGURE 2 is an enlarged cross-sectional view of the threading device with the lower protective cap of the magazine removed.

In general, my threading device is particularly adapted for inserting a relatively fine, flexible elongate element through a small passage. The member having this small passage is provided with an additional passage which opens into the first named passage. Means is provided for causing a fluid to pass into and through the first named passage and out the additional passage to guide the lead wire placed in proximity to the inlet opening of the first named passage into the first named passage and through the first named passage. In placing an additional passage, it is desirable that it open into the first named passage at a point which is relatively close to the end opposite the inlet end for the fluid of the first named passage so that the friction of the fluid on the lead wire is more than adequate to overcome the friction between the lead wire and the side walls of the first named passage in the member. The magazine provided with the threading device makes it possible to thread the capillary tubes prior to use of the same. The magazine also serves to protect the lead wire from dust and to protect the capillary bonding tube.

More in particular as shown in the drawings, our threading device 11 with magazine 12 is particularly adapted to be utilized in a thermocompression lead bonding machine 13 of the type described in copending application Serial No. 66,207, filed Oct. 31, 1960, now Pat. No. 3,050,617. As disclosed in that copending application, the thermocompression lead bonding machine 13 includes a stage 14 which is affixed to a vertically movable carriage block 16 upon which are mounted a plurality of rollers 17 engaging a pair of support columns 18. The support columns 18 are mounted upon a carriage plate 19 which is adapted to be moved sideways, and forwardly and rearwardly with respect to a base plate 21 by use of a manipulator and control lever 22. An element or header holder 23 is mounted on the base plate. A control housing 24 is mounted on top of the support columns 18 and carries a mounting bracket 26 which is adapted to support the magazine 12 as hereinafter described.

Our magazine 12 consists of a lower section 31 which is provided with a pair of spaced parallel vertical side walls 32, joined by an inclined bottom wall 33, a pair of spaced front and rear vertical walls 34 and 36 extending at an angle at right angles to the side walls 32 and a bottom wall 37 joining the side walls 32 and front and rear walls 34 and 36. An additional rear vertical wall 38 forms a part of the lower section 31. It will be noted that the upper edge 39 of each of the side walls 32 is first inclined downwardly towards the left as viewed in FIGURE 1 at 39*a* and then drops vertically at 39*b*, and then extends in a horizontal plane at 39*c* for a purpose hereinafter described.

Figures 4, 5:
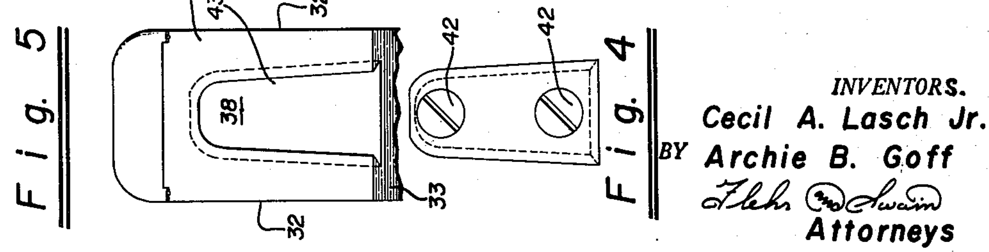
FIGURE 4 is a view looking along the line 4—4 of FIGURE 3, and particularly shows the dove-tailing means provided on the thermocompression lead bonding machine.
FIGURE 5 is a view looking along the line 5—5 of FIGURE 3 and particularly shows the dove-tailing means provided on the magazine.

A wedge block 41 is secured to the mounting bracket 26 by suitable means such as screws 42. This wedge block has a conformation as shown in FIGURE 4. It serves as a male member which is adapted to engage a female recess 43 provided in the vertical rear wall 38 to thereby provide a dove-tail arrangement well known to those skilled in the art for supporting the magazine 12 on the bracket 26.

Figures 3, 6:
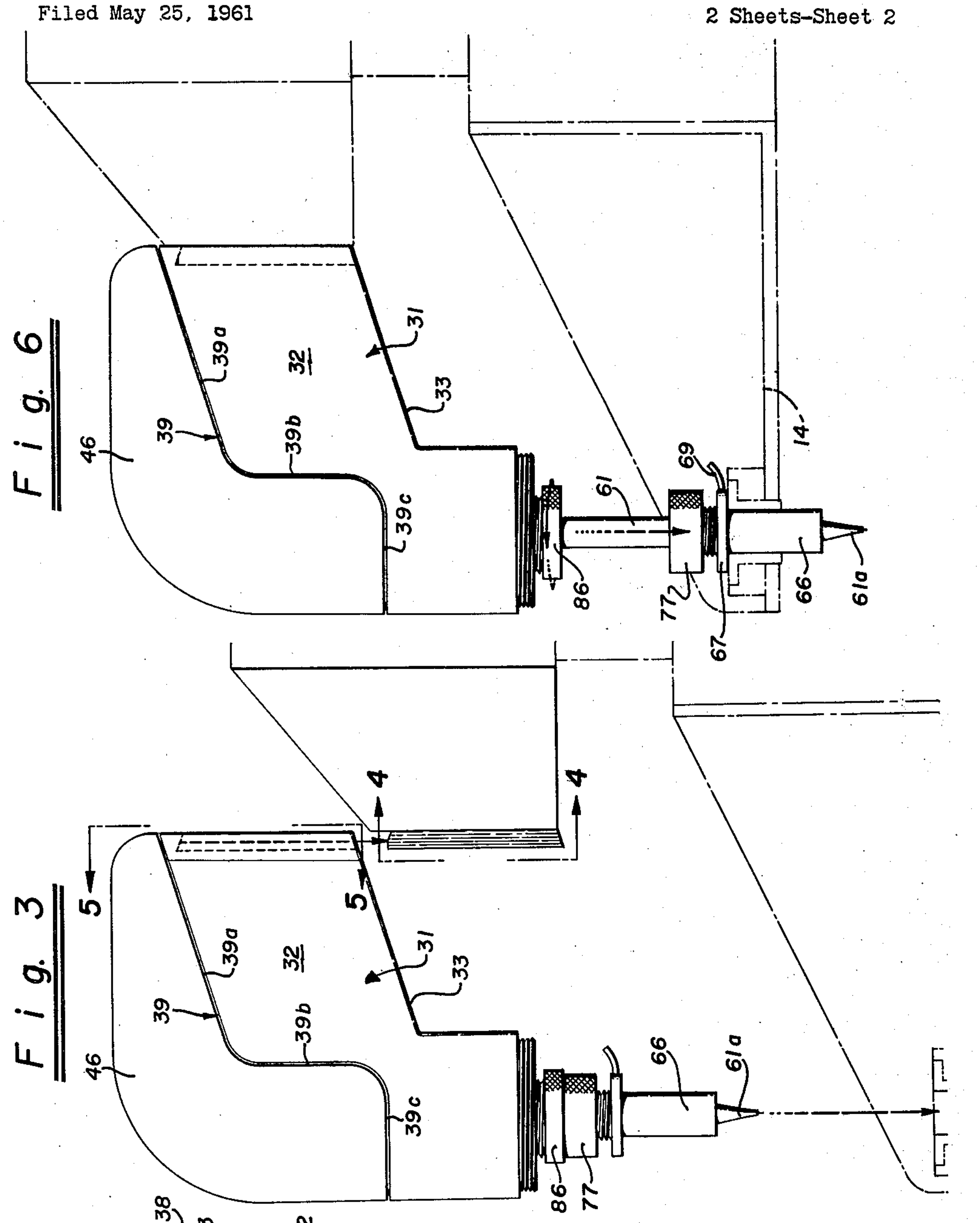
FIGURE 3 is an enlarged side elevational view of the magazine showing it being lowered into position onto the thermocompression lead bonding machine.
FIGURE 6 is an enlarged detailed view showing the magazine with the bonding tool in a position ready for use.

The upper section of the magazine consists of a cover 46 which is formed in such a manner that it is adapted to seat on the surfaces 39*a*, 39*b* and 39*c* provided on the lower section as shown particularly in FIGURES 2 and 3. It will be noted that the rear wall 38 of the lower section is provided with a rounded extension 38a which extends above the upper edges of the side walls 38 and is adapted to be engaged by an extension 46a provided on the cover 46. The lower front edge of the cover 46 is also adapted to engage an extension 34a provided on the front wall 34 as shown particularly in FIGURE 2. Suitable sealing means such as an O-ring 47 is mounted in the upper edges of the side walls 31, the front wall 34, and the rear wall 38 to form a relatively dust-tight seal between the cover 46 and the lower section 31 of the magazine. The magazine 12 also includes a removable cap 51 which is adapted to be threaded on the lower portion of the lower section 31 of the magazine. The cap 51 consists of an upper cylindrical portion 52 and a lower substantially conical portion 53. A web 54 is provided within the cap and extends across the same and is utilized for a purpose hereinafter described. The web 54 is formed with an opening 56, also provided for a purpose hereinafter described.

A reel or spool 58 is rotatably mounted in the lower section 31 of the magazine 12. The reel can be either of the types described in copending application Serial No. 66,207, filed October 31, 1960, or of the type disclosed in copending application Serial No. 112,644, filed May 25, 1961. The reel 58 has wound thereon a quantity of suitable lead wire as, for example, gold wire having a diameter of .0007 of an inch.

The threading device 11 which is mounted within the magazine 12 is comprised of a bonding tool in the form of a capillary tube 61 which has a very small passage 62 extending through the same. As is well known to those skilled in the art, the passage provided in such a capillary tube is substantially smaller at the lower end and preferably is only very slightly larger than the size of the lead wire 59 which is to pass through the bonding tool. Because of the very small inlet opening for the passage 62 and because of the very fine wire utilized, there has been considerable difficulty in manually threading the wire 59 into the capillary tube. It is for this reason that we have provided an additional passage 63 in the capillary tube. The passage 63 is positioned in such a manner that it opens into the first named passage 62 at a point which is relatively close to the small end of the capillary. This is desirable for reasons hereinafter described. It also will be noted that the passage 63 opens into the first named passage 62 in a direction which is substantially at right angles to the direction of the passage 62. Although I have shown the passage 63 as being formed as a small hole in the capillary tube, the opening into the passage 62 can take other forms. For example, it can consist of a small transfer slot which has been sawed into the capillary tube by a glass cut-off saw when the capillary tube is formed of glass. The opening also can be formed in the capillary tube by heating the glass and blowing a small hole through the side of the glass and into the passage 62.

The capillary tube 61 is carried by a cylindrical collet 66. The collet 66 is provided with a radially extending flange 67 which is adapted to seat on the web 54 provided on the cap 51 as hereinafter described. A bore 68 is provided in the collet and opens into the interior of the collet. A connector 69 is mounted in the passage and is connected to a tube 71 which is connected to a suitable vacuum source. It will be noted that the capillary tube 61 is disposed in the collet 66 in such a manner that the hole 63 is within the collet. Means is provided for sealing the upper and lower ends of the collet with respect to the capillary tube and consists of a suitable sealing material 73 engaging the tapered portion 61a of the capillary and held in place by an inturned annular ring 74 provided in the collet 66. It will be noted that this seal is established below the hole 63 provided in the capillary. The sealing means for the top of the collet consists of a sealing member in the form of a ferrule 76 of a suitable sealing material clamped into engagement with the upper end of the collet 66 and capillary tube 61 by a cap 77 threaded onto the collet 66. This assembly consisting of the collet 66 with the cap 77 consists of a bonding tool holder 78 for a purpose hereinafter described.

Means is provided for supporting the bonding tool 61 and the bonding tool holder 78 in the magazine and consists of a ring member 81 which is provided with an annular groove 82 which seats a portion of the lower wall 37 of the lower section 31 of the magazine. The ring member 81 is provided with a central opening 82 which is adapted to receive the capillary tube 61, as shown particularly in FIGURE 2. Means is provided for engaging the capillary tube and fastening to the ring member and consists of a ferrule 84 of a suitable material such as foam rubber which is mounted in the ring member 81 and is adapted to be compressed into engagement with the capillary tube 61 by a cap 86 to firmly support the capillary tube 61 and to clamp it to the ring member 81 and to the magazine.

Additional sealing means is provided in the magazine and consists of a ferrule 87 of suitable material such as polyethylene which is seated in the ring member 81 and adapted to be urged into engagement with the capillary tube 61 by a cap 88 which is threaded onto the upper end of the ring member 81 within the lower section 31.

Operation and use of our threading device in performing our method may now be briefly described in conjunction with the operation and use of the magazine. Let it be assumed that it is desired to utilize a plurality of magazines and to pre-load the same for use with thermo-compression lead bonding machines of the type shown in FIGURE 1.

When such is the case, the cover 46 is raised by lifting the front end of the cover upwardly and tilting the same about the extension 38a of the rear wall 38 of the lower section of the magazine. After the cover has been raised, a capillary tube 61 can be inserted in the magazine if necessary. The capillary tube is inserted by first loosening the caps 77, 84 and 88, and then dropping the capillary tube downwardly into the ferrule so that the tapered end of the capillary tube seats firmly against the sealing material 73. Thereafter, the cap 77 is tightened to cause seating of the sealing material 76 against the capillary tube to form a sealed chamber within the collet 66 which opens into the hole 63 previously provided in the capillary tube. The capillary tube 61 and the holder 78 are then firmly secured to the magazine by tightening the cap 86 to cause the resilient material 84 to firmly engage the capillary tube to prevent the capillary tube and its holder from dropping downwardly. If necessary, the cap 88 is also tightened so that the sealing material 87 forms a relatively tight seal between the capillary tube and the magazine.

Thereafter, the hole 71 which is connected to a vacuum supply (not shown) is connected to the connector 69 to place the chamber within the collet 66 under a vacuum and to thereby cause a fluid such as air to enter the passage 62 and to be discharged out through the hole 63 into the vacuum system. Considerably more air will pass through the upper end of the passage 62 rather than the lower end of the passage 62 because of the considerable narrowing of the lower end of the passage in the area of the pointed end 61a of the capillary tube.

With the cap 46 in an open position, a reel 58 is mounted in the magazine which has a lead wire 59 wound thereon. The lead wire is then threaded through the capillary tube by moving the end of the lead wire 59 in the vicinity of the inlet opening of the passage 62 so that the inrushing air will frictionally engage the fine wire to rapidly draw the fine wire into the inlet end of the passage 62 of the capillary tube. The air passing into the passage 62 continues to draw the lead wire 59 with it because the friction of the air passing over the wire is greater than the friction between the wire and the capillary tube because of the fact that the wire only touches the capillary tube at very few points. This continued movement of the air or fluid causes the wire to travel rapidly through the passage 62. As it enters the lower portion of the capillary tube, it does not enter into the passage 63 because the passage 63 extends at right angles to the passage 62. It continues past the passage 62 because of the inertia and stiffness of the travelling wire and also because of the fact that a large surface area of the wire is exposed to the air travelling in the passage 62 to continue pulling the wire into the passage 62. The wire also does not pass into the passage 63 because it is relatively stiff and will not turn the sharp corner and go out the opening or passage 63.

Because of the fact that it is desirable to have a large surface area of the wire exposed to the passing air, it is desirable to have the passage 63 provided as close as possible to the lower end of the capillary tube so that the ratio of the surface of the wire exposed to the passage of air within the tube and the portion of the wire not exposed to the passage of air is as large as possible. This assures that the wire will always readily and easily be threaded through the capillary tube.

As soon as the wire is passed through the tube, the vacuum supply is cut off in a suitable manner such as by removing the tube 71 from the connector 69. Thereafter, the cap 51 is put in place by threading it onto the lower section 31 of the housing. The cap, when in position as shown in dot and dash lines in FIGURE 2, serves to support the collet 66 by having the web 54 engage the flange 67. The cap 51 also serves to protect the lower extremity of the capillary tube 61 which is utilized for the bonding operation as described in copending application Serial No. 66,207, filed Oct. 31, 1960. As soon as this has been accomplished, the cover 46 can be replaced. Additional magazines can be reloaded in the same manner.

When it is desired to utilize one of the magazines on the bonding machine shown in FIGURE 1, it is merely necessary to remove the magazine previously used and then to place the new magazine on the machine as shown in FIGURE 3. The operator then removes the cap 51. After the cap is removed, the knurled cap 86 is turned to release the pressure applied by the resilient member 84 to permit the capillary tube and its holder to drop downwardly so that the collet 66 can seat in the stage 14 as described in copending application Serial No. 66,207, filed Oct. 31, 1960. As soon as this has been accomplished, the operator can continue with the bonding operations in a manner identical to that described in copending application Serial No. 66,207, filed Oct. 31, 1960. As soon as it becomes necessary to replace the bonding tool or when the lead wire in the magazine has been exhausted, a new magazine can be placed on the bonding machine in a similar manner with little effort.

With the arrangement shown, it is apparent that it is possible for an operator to operate the lead bonding machine 13 at its full capacity without losing any time for threading the capillary tubes and the like. By the utilization of detachable magazines, the threading operation and the like can be accomplished at a separate location. The magazine is formed in such a manner so that it is relatively dust-tight to prevent contamination of the lead wire which is utilized in the bonding operation.

Although we have disclosed our threading device utilizing a vacuum, it is readily apparent that if desired, in place of the vacuum, air or any other suitable fluid such as nitrogen could be supplied into the interior of the magazine 12 at a pressure above atmospheric pressure to thereby cause the passage of fluid through the passage 62 and out through the passage 63 to be exhausted to the atmosphere. This arrangement will also cause fluid to flow rapidly through the passages 62 and 63 and to cause the wire to be rapidly threaded through the capillary tube.

It is apparent from the foregoing that we have provided a new and improved threading device and magazine for use therewith together with a method for threading very fine lead wires through capillary tubes having very small passages. The threading device and magazine are both relatively economical to construct.

It is also readily apparent that although we have described our threading device and method for use particularly with a thermocompression lead bonding machine, the same apparatus and techniques can be utilized in other applications where it is desirable to thread very fine elongate flexible elements through very small passages provided in rigid members.

We claim:

1. In a device for threading a relatively fine flexible elongate element, a magazine, a reel rotatably mounted in the magazine, a quantity of relatively fine flexible elongate element wound on the reel, a capillary tube, means for releasably securing the capillary tube to the magazine, a capillary tube holder mounted on the lower end of the capillary tube and forming a sealed chamber about the lower end of the capillary tube, the capillary tube having a passage extending therethrough, an additional passage formed in the capillary tube and opening into the chamber in the capillary tube holder, and means for placing the chamber under a vacuum to cause fluid to be drawn into the first named passage into the capillary tube and out the additional passage so that the fluid frictionally engages the flexible elongate element when it is placed in the vicinity of the inlet end of the first named passage to thereby cause the flexible elongate element to be drawn into the first named passage and threaded through the first named passage in the capillary tube.

2. A device as in claim 1 wherein said means for releasably securing the capillary tube includes means for releasing the capillary tube and the capillary tube holder to permit vertical movement of the capillary tube and the capillary tube holder relative to the magazine.

3. A device as in claim 1 together with a cap mounted on the lower end of the magazine and serving to protect the capillary tube.

4. A device as in claim 1 wherein the magazine is provided with a removable cover to permit access to the reel and to the upper end of the capillary tube.

5. In a device for threading a relatively fine flexible elongate element, a member defining a space, a capillary tube removably mounted in the member so that a portion of the capillary tube is disposed within said space, cooperative sealing means associated with the capillary tube and the member so that when the capillary tube is mounted in the member a sealed chamber is formed between the capillary tube and said member, said capillary tube having a passage extending therethrough, the size of the passage at one end being substantially less than the size of the passage at the other end, an additional passage formed in the capillary tube and opening into the first named passage at a point in the vicinity of the smaller end of the first named passage, said additional passage also opening into said sealed chamber formed between the capillary tube and the member, said member being formed with a hole opening into said chamber, and means for causing fluid to flow into the larger end of the first named passage and out the additional passage and into the chamber and out through said hole in said member to thereby cause the fluid to frictionally engage the lead wire as it is placed in the vicinity of the inlet opening of the first named passage to thereby draw the flexible element into the first named passage and to cause it to travel through the first passage.

6. A device as in claim 5 wherein said means for causing fluid to flow consists of means for placing the chamber formed between the capillary tube and the member under a vacuum.

7. In a magazine, a lower casing, a spool rotatably mounted in said lower casing, the spool carrying a length of flexible elongate element wound thereon, a holder mounted in the casing, a member mounted in the holder, a capillary tube removably mounted in the holder and extending through said member, cooperative means associated with said member and said capillary tube to form a sealed chamber between the capillary tube and the member, the capillary tube having a passage extending therethrough and forming an inlet opening, the capillary tube having an additional passage opening into the first named passage and into the chamber formed in the member, the holder having means for releasably securing the capillary tube in the holder, the member having a hole therein opening into said chamber, and means for causing fluid to flow into the first named passage in the capillary tube at one end and out the additional passage to thereby cause the fluid to frictionally engage the lead wire as it is placed in the vicinity of the inlet opening of the first named passage to thereby draw the flexible elongate element into the first named member and cause it to travel through the first named passage.

8. A magazine as in claim 7 together with a cover movable between open and closed positions enclosing the reel and the upper end of the capillary tube, said cover when in an open position serving to permit access to the reel and the upper end of the capillary tube.

References Cited in the file of this patent

UNITED STATES PATENTS

| | | |
|---|---|---|
| 2,115,423 | Korver | Apr. 26, 1938 |
| 2,481,197 | Caille | Sept. 6, 1949 |
| 2,509,279 | Sisson | May 30, 1950 |
| 2,622,306 | Anderson | Dec. 23, 1952 |
| 2,634,491 | McDermott | Apr. 14, 1953 |
| 2,672,712 | Reiter | Mar. 23, 1954 |
| 2,675,908 | Griset | Apr. 20, 1954 |
| 2,681,401 | Anderson | June 15, 1954 |
| 2,685,413 | Reiners | Aug. 3, 1954 |
| 2,755,857 | Furst | July 24, 1956 |
| 2,769,599 | Furst | Nov. 6, 1956 |
| 2,778,910 | Landis et al. | Jan. 22, 1957 |
| 2,880,457 | Schuller | Apr. 7, 1959 |
| 2,885,257 | Courtney et al. | May 5, 1959 |
| 2,971,683 | Paulsen | Feb. 14, 1961 |
| 3,018,975 | Kulicke | Jan. 30, 1962 |
| 3,050,617 | Lasch et al. | Aug. 21, 1962 |